United States Patent [19]

Kyogoku et al.

[11] Patent Number: 4,704,526
[45] Date of Patent: Nov. 3, 1987

[54] APPARATUS OF REGULATING SHAPE OF FOCUSED ION BEAMS

[75] Inventors: Hideaki Kyogoku; Takashi Kaito, both of Tokyo, Japan

[73] Assignee: Seiko Instruments & Electronics Ltd., Tokyo, Japan

[21] Appl. No.: 783,247

[22] Filed: Oct. 2, 1985

[30] Foreign Application Priority Data

Oct. 9, 1984 [JP] Japan ................................ 59-211675

[51] Int. Cl.[4] ............................................ G01N 23/00
[52] U.S. Cl. .................................... 250/307; 250/309; 250/397
[58] Field of Search ............. 250/305, 310, 309, 492.2, 250/307, 397

[56] References Cited

U.S. PATENT DOCUMENTS

| | | | |
|---|---|---|---|
| 3,628,014 | 12/1971 | Grubic | 250/305 |
| 3,772,520 | 11/1973 | Varker | 250/307 |
| 4,041,311 | 8/1977 | Martin | 250/310 |
| 4,219,731 | 8/1980 | Migitaka et al. | 250/310 |
| 4,503,329 | 3/1985 | Yamaguchi et al. | 250/309 |
| 4,560,872 | 12/1985 | Antonovsky | 250/310 |
| 4,588,890 | 5/1986 | Finnes | 250/307 |

Primary Examiner—Bruce C. Anderson
Attorney, Agent, or Firm—Bruce L. Adams; Van C. Wilks

[57] ABSTRACT

An apparatus for regulating the shape of a focused ion beam irradiates a sample which is comprised of a pattern on a substrate with a scanning ion beam, detectors for detecting two kinds of secondary ions one emitted from the substrate and the other emitted from the pattern, comparators for comparing the detected signals with respective predetermined values and then converting the detected signals into binary signals, and a color display for displaying the shapes of the substrate and the pattern in the form of pictures of different colors on the basis of the binary signals corresponding to each kind of secondary ions. The spot shape of the ion beam is corrected with an astigmatic correction electrode and/or an object lens while observing the shape of the overlapping portions of the pictures of different colors.

19 Claims, 6 Drawing Figures

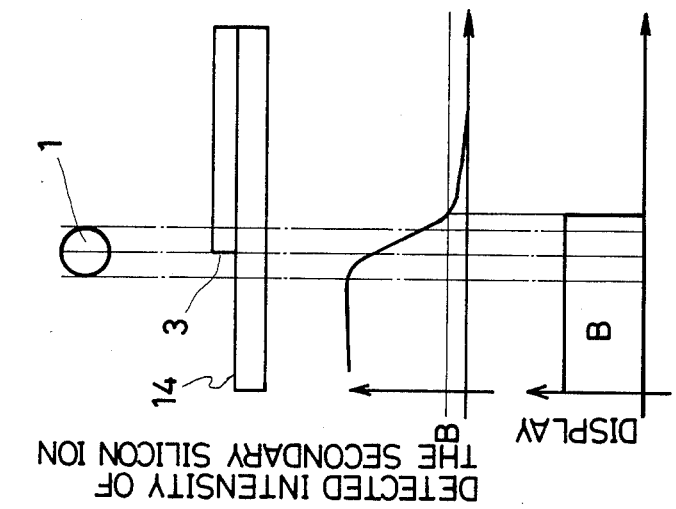
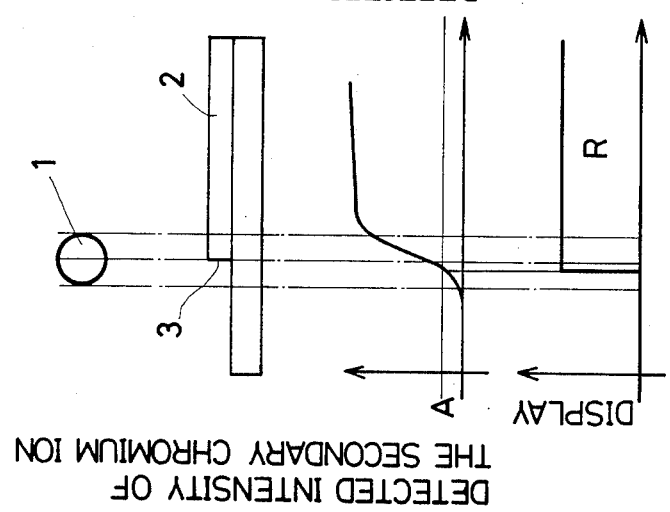

APPARATUS OF REGULATING SHAPE OF FOCUSED ION BEAMS

BACKGROUND OF THE INVENTION

This invention relates to an apparatus for repairing defects in a mask, which is used in semiconductor manufacture, by using an ion beam, and more particularly relates to an ion beam regulating apparatus for obtaining a suitable spot shape of a focused ion beam.

A conventional method of focusing and correcting astigmatic ion beams is as follows.

The intensity of secondary ions which are generated in the surface of a pattern when a sample is scanned with a focused ion beam is detected by a detector. A signal representative of the detected intensity is introduced as a picture signal into a picture display unit so as to observe an image of the pattern. Since the spot shape 1 of this ion beam on the surface of the sample has a predetermined area, an end region 3 of the image obtained of the pattern 2 is not clear, and the brightness of the end region 3 varies continuously in accordance with variations in the diameter of the ion beam spot as shown in FIG. 2. The diameter of the ion beam spot is regulated as this region of varying brightness of the image is observed.

In a conventional ion beam regulating method, a beam spot is regulated according to an end region, the brightness of which varies continuously, of a pattern observed with the naked eye, so that the beam spot cannot be accurately regulated. Also regulating this beam spot requires great skill.

SUMMARY OF THE INVENTION

To solve these problems, the present invention provides an apparatus for regulating the shape of focused ion beams, comprising means for irradiating a mask which consists of a substrate and a pattern formed on the substrate with an ion beam which is discharged from an ion supply source, while scanning the mask with the ion beam in XY-directions; means for separating from each other first kind of secondary ions which occur in the surface of the substrate due to the ion beam applied to the mask and second kind of secondary ions which occur in the surface of the pattern due to the same ion beam; means for detecting the intensity of each of the two kinds or groups of secondary ions separated from each other; means for comparing detected signals which represent the intensities with a predetermined value and then converting the signals into binary signals; means for displaying the shapes of the substrate and pattern in the form of pictures of different colors or brightness on the basis of the binary signals corresponding to the first and second secondary ions, and means for correcting the spot shape of the ion beam by using an astigmatic correction electrode and an object lens while observing the shape of the overlapping portions of the pictures of different colors or brightness.

According to the apparatus of regulating the shape of focused ion beams of the present invention, the color or brightness of an image of an end region of a pattern is displayed discontinuously and differently from those of images of a surface portion of a substrate and a central portion of the pattern in accordance with the shape of an ion beam spot, so that the former image can be discriminated very easily with the naked eye. Therefore, the shape of the ion beam can be regulated accurately on the basis of the image of the end or edge portion of the pattern.

BRIEF DESCRIPTION OF THE DRAWINGS

FIGS. 3a, 3b, 4 and 5 are diagrams used to describe the present invention.

DETAILED DESCRIPTION OF PREFERRED EMBODIMENTS

Figure 1:
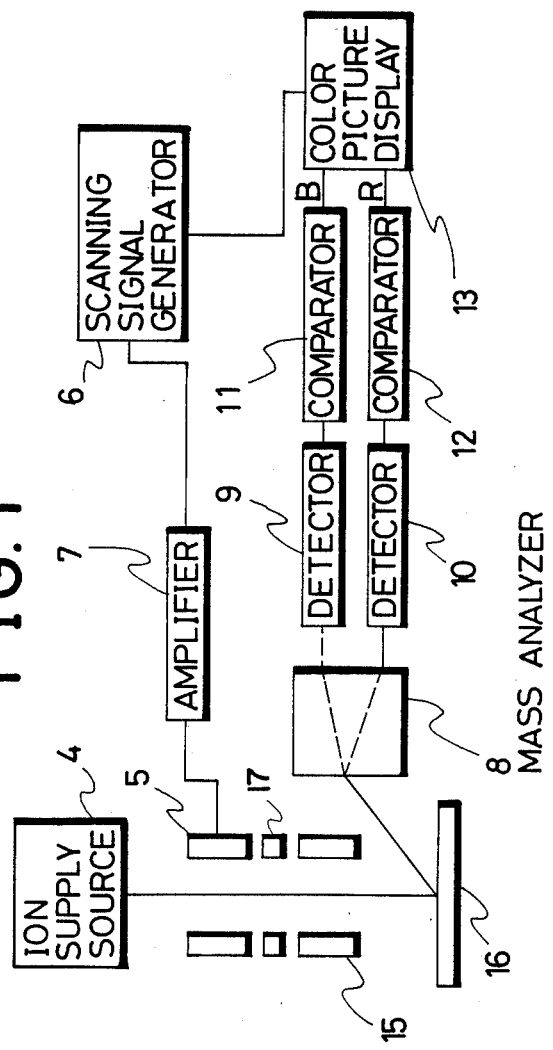
FIG. 1 shows an apparatus used to practice the method of regulating the shape of focused ion beams according to the present invention.
Figure 2:
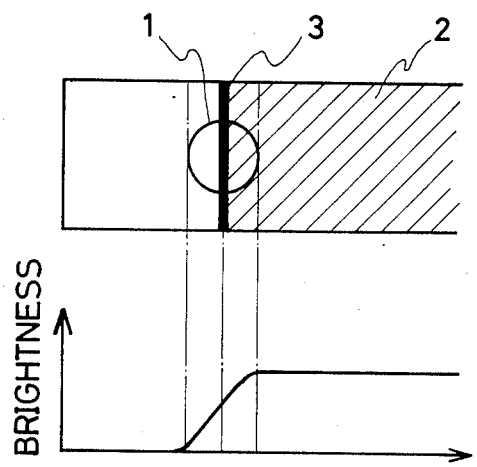
FIG. 2 is a diagram used to describe a conventional method of regulating the shape of focused ion beams.

An embodiment of the present invention will now be described in conjunction with the drawings. FIG. 1 illustrates an apparatus for repairing defects in a sample in the form of a mask with an ion beam, which is used in the present invention. To carry out a mask defect repairing operation, it is necessary to detect defects first. To detect defects in a mask 16, a particle beam in the form of an ion beam is generated from an ion supply source 4, and the surface of the mask 16 is scanned with the ion beam as a deflector 5 is driven to move or sweep the ion beam in the XY-directions. During this time, the deflector 5 is driven by a signal from a scanning signal generator 6 through an amplifier 7.

Due to the scanning ion beam irradiated onto the mask surface, secondary ions are emitted or released therefrom. The secondary particles or ions thus emitted from the mask surface consists of two types or kinds of secondary ions since the substrate and the pattern which constitute the mask 16 consists of different materials. For example, silicon ions are released from the substrate surface, and chromium ions are released from the pattern surface.

These two types of ions are separated by a mass analyzer 8. These two types of separated second ions are detected by detectors 9, 10, and electric output signals the levels of which correspond to the intensities of these secondary ions are obtained.

These electric output signals are then introduced into comparators 11, 12, and binarized to "1" when the level of a signal is higher than a predetermined level or value, and "0" when the level of a signal is not higher than the predetermined level or value.

The binary signals thus obtained are introduced into a blue terminal B and a red terminal R of a color picture display 13. Consequently, the substrate surface is displayed, for example, in the form of a uniform blue substrate picture, and the pattern surface in the form of a uniform red pattern picture.

At an end or edge region of the pattern, these two colors can not be distinguished from each other; such a region of a certain width is displayed in purple which is chromatically between blue and red. The reasons why this phenomenon occurs will now be explained.

Referring to FIG. 3a, an ion beam spot 1 has a predetermined area. When this ion beam is applied to a mask surface, the detected intensity of the secondary chromium ions emitted from the surface of a pattern 2 varies continuously in the vicinity of an end region 3 thereof as shown in FIG. 3a. To obtain a binary signal corresponding to the intensity of the secondary chromium ions, a threshold electric potential at a comparator is then set as shown by a line A in FIG. 3a. As a result, a region which is on the right side of the intersection of the line A and a curve of the detected intensity of the secondary chromium ions is displayed pictorially in red.

Referring to FIG. 3b, when the ion beam 1 is irradiated on the mask surface, the detected intensity of the secondary silicon ions released from a substrate surface 14 varies continuously in the vicinity of the end region 3 of the pattern as shown in the drawing. To obtain a binary signal corresponding to the intensity of the secondary silicon ions, a threshold electric potential value at another comparator is then set as shown by a line B in FIG. 3b. As a result, a region which is on the left side of the intersection of the line B and a curve on the detected intensity of the secondary silicon ions is displayed pictorially in blue.

Consequently, as may be understood from the results of comparison between FIG. 3a and FIG. 3b, the red and blue images overlap each other in the portion of the pattern which is in the vicinity of the end portion 3 thereof, and the overlapping portion has a predetermined width which is purple in color due to the mixture of the overlapping red and blue picture portion. The width of this overlapping portion is proportional to the diameter of the ion beam spot.

Figure 4:
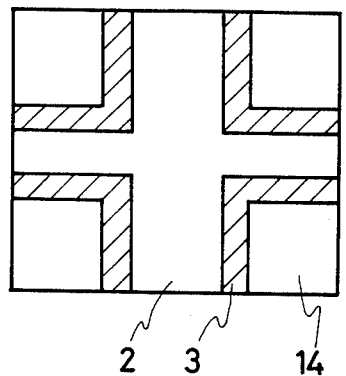

FIG. 4 shows a concrete image. The pattern portion 2 is displayed in red, and the substrate surface portion 14 is displayed in blue. The pattern end portion 3 and the neighboring portion are displayed in purple.

The width of the purple region can be recognized clearly with the naked eye. The focal length of the object lens 15 in FIG. 1 may be regulated according to the width of the observed purple region. Since the diameter of the ion beam spot is proportional to the width of the purple image, a suitable diameter of the ion beam spot can be obtained with reference to the width of the purple image.

Figure 5:
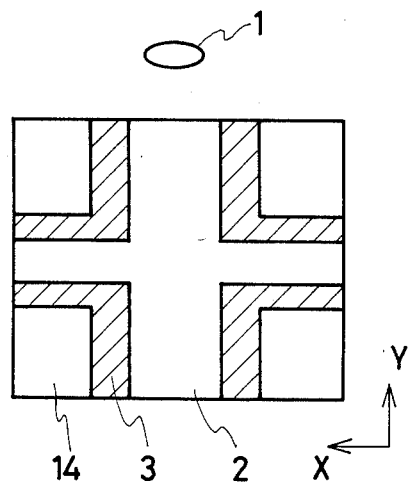

When the ion beam spot is flat or deformed in the X-direction as shown in FIG. 5, the width of the purple image region in the X-direction is larger than that of the purple image region in the Y-direction thereby creating astigmatism. To correct such an astigmatic spot, the astigmatic correction electrode 17 shown in FIG. 1 may be controlled as the image is observed, in such a manner that the width of the purple image region in the X-direction and that of the purple image region in the Y-direction become equal.

It is evident that the present invention can also be applied to the case where a substrate surface and a pattern surface are displayed at different levels of brightness rather than in different colors, i.e., the different color tones of the display may be attained by different brightness levels or by different colors.

According to the present invention described above, an ion beam can be focused and astigmatically corrected accurately, quickly and easily as the region of a displayed image of a mask which has a predetermined color or brightness is observed.

What is claimed is:

1. An apparatus for regulating a spot shape of an ion beam, comprising: means for irradiating a scanning ion beam onto a sample comprised of a substrate and a pattern formed on the substrate; means for detecting two kinds of secondary ions, one released from the substrate by the irradiation of the scanning ion beam and the other released from the pattern by the irradiation of the scanning ion beam, to produce two corresponding output signals; means for comparing the two output signals with predetermined values respectively to convert the two output signals into two binary signals; means for displaying the shape of the substrate and the pattern in the form of partly overlapped pictures of different colors according to the two binary signals corresponding to the two kinds of secondary ions; and means for correcting the spot shape of the scanning ion beam according to the shape of the overlapping portions of the pictures of different colors.

2. An apparatus according to claim 1; including an ion supply source for producing an ion beam.

3. An apparatus according to claim 2; including means for scanning the ion beam in X and Y directions relative to the sample during the irradiation of the ion beam.

4. An apparatus according to claim 1; including means for separating the secondary ions released from the sample into the two kinds of secondary ions corresponding to the substrate and the pattern.

5. An apparatus according to claim 4; wherein the means for separating comprises a mass analyzer.

6. An apparatus according to claim 4; wherein the means for detecting comprises a pair of detectors for detecting the two kinds of separated secondary ions respectively.

7. An apparatus according to claim 6; wherein the means for comparing comprises a pair of comparators connected to respective ones of the detectors.

8. An apparatus according to claim 1; wherein the means for displaying includes means for coloring the substrate picture by one of the colors red and blue, coloring the pattern picture by the other of the colors red and blue, and coloring the overlapping picture portion by a color mixture of red and blue.

9. An apparatus according to claim 1; wherein the means for correcting includes an astigmatic correction electrode for correcting an astigmatic spot of the ion beam.

10. An apparatus according to claim 1; wherein the means for correcting includes an objective lens for correcting the diameter of the spot of the ion beam.

11. An apparatus according to claim 1; in combination with a sample comprised of a mask used in semiconductor manufacture.

12. An apparatus according to claim 11; wherein the mask comprises a substrate composed of silicon and a pattern composed of chromium.

13. An apparatus according to claim 12; wherein the means for detecting comprises a pair of detectors for detecting two kinds of secondary ions composed of silicon and chromium respectively.

14. A method of regulating a spot shape of an ion beam, comprising the steps of: irradiating a scanning ion beam onto a sample composed of a substrate and a pattern formed on the substrate; detecting two kinds of secondary ions, one released from the substrate by the irradiation of the scanning ion beam and the other released from the pattern by the irradiation of the scanning ion beam, to produce two corresponding output signals; comparing the two output signals with predetermined values respectively to convert the two output signals into two binary signals; displaying the shape of the substrate and the pattern in the form of partly overlapped pictures of different colors according to the two binary signals corresponding to the two kinds of secondary ions; and correcting the spot signal of the scanning ion beam with an astigmatic correction electrode and/or an object lens according to the shape of overlapping portions of the pictures of different colors.

15. An apparatus for regulating the shape of a spot formed by a particle beam irradiated onto a sample comprising: means for scanning a particle beam across a sample comprised of a pattern of one material formed on a substrate of another material to effect the emission of one kind of secondary particles from the pattern and the emission of another kind of secondary particles from the substrate; means for detecting the two kinds of emitted secondary particles and producing two binary signals representative of the respective intensity levels of the two kinds of emitted secondary particles; means for displaying the shape of the pattern and the substrate in the form of a pattern picture of a first color tone and a substrate picture of a second color tone in accordance with the two binary signals such that the pattern and substrate pictures overlap to form an overlapped picture portion of a third color tone having a dimension proportional to the shape of the spot formed by the particle beam irradiating the sample; and means for regulating the shape of the particle beam spot based on the overlapped picture portion.

16. An apparatus according to claim 15; wherein the means for regulating comprises an objective lens for varying the size of the particle beam spot.

17. An apparatus according to claim 15; wherein the means for regulating comprises a manually controllable objective lens for enabling varying of the size of the particle beam spot while observing the corresponding variation of shape of the overlapped picture portion.

18. An apparatus according to claim 17; wherein the means for regulating further comprises manually controllable means for correcting for astigmatism of the particle beam spot while observing the corresponding variation of shape of the overlapped picture portion.

19. An apparatus according to claim 15; wherein the means for regulating comprises means for correcting for astigmatism of the particle beam spot.

* * * * *